US012622069B2

(12) United States Patent
Van Mierloo et al.

(10) Patent No.: US 12,622,069 B2
(45) Date of Patent: May 5, 2026

(54) PHOTOVOLTAIC ELEMENT AND POLYMER COMPOSITION FOR FRONT SHEET THEREOF

(71) Applicant: SABIC GLOBAL TECHNOLOGIES B.V., Bergen op Zoom (NL)

(72) Inventors: Sarah Van Mierloo, Geleen (NL); Maud Corrina Willie Van Der Ven, Geleen (NL); Henrica Norberta Alberta Maria Steenbakkers-Menting, Geleen (NL); Roland Van Giesen, Geleen (NL)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 327 days.

(21) Appl. No.: 17/252,802

(22) PCT Filed: Jul. 11, 2019

(86) PCT No.: PCT/EP2019/068673

§ 371 (c)(1),
(2) Date: Dec. 16, 2020

(87) PCT Pub. No.: WO2020/011917

PCT Pub. Date: Jan. 16, 2020

(65) Prior Publication Data

US 2021/0265516 A1 Aug. 26, 2021

(30) Foreign Application Priority Data

Jul. 12, 2018 (EP) .................................... 18183191

(51) Int. Cl.
*H10F 19/80* (2025.01)
*C08K 13/02* (2006.01)
*H02S 20/23* (2014.01)

(52) U.S. Cl.
CPC ........... *H10F 19/804* (2025.01); *C08K 13/02* (2013.01); *H02S 20/23* (2014.12); *C08K 2201/014* (2013.01)

(58) Field of Classification Search
None
See application file for complete search history.

(56) References Cited

U.S. PATENT DOCUMENTS

| | | | | |
|---|---|---|---|---|
| 4,985,479 | A | 1/1991 | Nagasaki et al. | |
| 2012/0279029 | A1 | 11/2012 | Basfar et al. | |
| 2015/0007883 | A1 | 1/2015 | Ikenaga et al. | |
| 2015/0353710 | A1 | 12/2015 | Ayabe et al. | |
| 2016/0177049 | A1 * | 6/2016 | Sakuma | C08K 5/17 524/236 |
| 2017/0077333 | A1 * | 3/2017 | Piel | B32B 27/08 |
| 2017/0137613 | A1 * | 5/2017 | Andrews | C08K 5/0058 |
| 2018/0050525 | A1 | 2/2018 | Hulsmann et al. | |
| 2020/0172707 | A1 | 6/2020 | Van Mierloo et al. | |

FOREIGN PATENT DOCUMENTS

| | | | | |
|---|---|---|---|---|
| CN | 108250572 A | 7/2018 | | |
| JP | 06212033 A | 8/1994 | | |
| WO | 2009080281 A1 | 7/2009 | | |
| WO | 2016102278 A1 | 6/2016 | | |
| WO | WO-2017175524 A1 * | 10/2017 | C01B 25/45 | |

OTHER PUBLICATIONS

International Search Report for International Application No. PCT/EP2019/068673, International Filing Date Jul. 11, 2019, Date of Mailing Oct. 18, 2019, 6 pages.

Written Opinion for International Application No. PCT/EP2019/068673, International Filing Date Jul. 11, 2019, Date of Mailing Oct. 18, 2019, 10 pages.

* cited by examiner

*Primary Examiner* — Dustin Q Dam

(74) *Attorney, Agent, or Firm* — CANTOR COLBURN LLP

(57) ABSTRACT

The present invention relates to a photovoltaic element, comprising a front layer, a back layer, and a plurality of photovoltaic cells, which photovoltaic cells are present between the front layer and back layer, wherein the front layer consists of a polypropylene composition, comprising: a) a random polypropylene resin; b) a mixture of light stabilizing additives; said mixture comprising: i) a high molecular weight hindered tertiary amine light stabilizer (t-HM-HAL S) having a weight average molecular weight of at least 1600 g/mol; ii) a low molecular weight hindered secondary amine light stabilizer (s-LM-HALS) having a weight average molecular weight of below 1000 g/mol; iii) an ultraviolet synergist, being a n-alkyl-3,5-dialkylated 4-hydroxybenzoate; iv) an ultraviolet absorber, being a hydroxybenzotriazole compound or a hydroxyl benzophenone compound or a mixture thereof; c) a mixture of antioxidant additives; said mixture comprising: i) a phenolic antioxidant; and ii) a phosphite additive. The invention also relates to a polypropylene composition and to the use thereof as front layer.

20 Claims, No Drawings

PHOTOVOLTAIC ELEMENT AND POLYMER COMPOSITION FOR FRONT SHEET THEREOF

CROSS REFERENCE TO RELATED APPLICATIONS

This application is a National Stage application of PCT/EP2019/068673, filed Jul. 11, 2019, which claims the benefit of European Application No. 18183191.8, filed Jul. 12, 2018, both of which are incorporated by reference in their entirety herein.

TECHNICAL FIELD

The present invention relates to a photovoltaic element, comprising a front layer, a back layer, and a plurality of photovoltaic cells, which photovoltaic cells are present between the front layer and back layer, wherein the front layer consists of a polypropylene composition. The invention also relates to a polypropylene composition and to the use thereof as front layer.

BACKGROUND

The present teachings relate to a photovoltaic element having a plurality of electrically interconnected photovoltaic, or, solar, cells placed in between a front layer and a back layer.

Polypropylene resins can deteriorate by heath, light and/or oxygen. UV degradation of polypropylene leads to a decline in mechanical properties concomitant with appearance changes (e.g. color, gloss) as well as transmittance. In particular the mechanical strength can be decreased and the polypropylene material can become coloured. In order to prevent such deterioration of a polypropylene composition, there have been proposed a number of additives, used either alone or in various combinations. For polypropylene random (PP random) building and construction applications visual and mechanical changes are playing an important role. Additionally it is important not to have a significant loss in transmittance due to degradation of the material.

Phenolic antioxidant (PAO) additives are widely employed to protect polypropylene random (PP random) against thermo-oxidative degradation during processing and in service conditions. Even though phenolic antioxidants offer good stabilisation of polypropylene, most phenolic antioxidants exhibit the disadvantage of yellowing due to their oxidation to coloured quinonoid compounds by air or NOx gases. Furthermore, the phenolic antioxidants often exert only a limited effect when employed alone.

Therefore phenolic antioxidants have been used in combination with other compounds. For example, phenolic antioxidants have been used in combination with phosphites which are known to enhance the effectiveness of the phenolic antioxidants due to complementary and synergistic mechanisms of action (e.g. decomposition of hydroperoxides formed in the polymer at high temperature and in the presence of oxygen). Phenolic antioxidants have also been combined with various light stabilisers in order to achieve a high weather resistance. Examples of light stabilisers include benzophenone, benzotriazole and triazine type ultraviolet radiation absorbers, hindered hydroxy-benzoates and hindered amine compounds. In particular, the application of hindered amine light stabilisers (HALS) has been more and more increased since they are non-colouring, exert a high photostabilising effect and also can improve the heat resistance.

However, providing adequate protection to polymer systems exposed to both severe ultraviolet (UV) radiation and high heat in service conditions still remains a challenge. For instance, applications such as building and construction, are particularly demanding and require high performing stabilising formulations to fulfil increased requirements in these applications.

SUMMARY

It is an object of the present invention to provide an improved polypropylene material for use as front layer in a photovoltaic module.

A further object of the invention is to provide a photovoltaic element which can be manufactured in an efficient manner at low costs, and which can be recycled in an efficient manner, to a large degree.

It is a further object of the present invention to provide a polypropylene composition having increased UV stability and good transparency.

In a first aspect, the teaching relates to a photovoltaic element, comprising a front layer, a back layer, and a plurality of photovoltaic cells, which photovoltaic cells are present between the front layer and back layer, wherein the front layer consists of a polypropylene composition, comprising:

a) a random polypropylene resin;
b) a mixture of light stabilizing additives; said mixture comprising:
  i) a high molecular weight hindered tertiary amine light stabilizer (t-HM-HALS) having a weight average molecular weight of at least 1600 g/mol;
  ii) a low molecular weight hindered secondary amine light stabilizer (s-LM-HALS) having a weight average molecular weight of below 1000 g/mol;
  iii) an ultraviolet synergist, being a n-alkyl-3,5-dialkylated 4-hydroxybenzoate;
  iv) an ultraviolet absorber, being a hydroxybenzotriazole compound or a hydroxyl benzophenone compound or a mixture thereof;
c) a mixture of antioxidant additives; said mixture comprising:
  i) a phenolic antioxidant; and ii) a phosphite additive.

The invention also relates to a composition comprising, a) a random polypropylene resin;
b) a mixture of light stabilizing additives; said mixture comprising:
  i) a high molecular weight hindered tertiary amine light stabilizer (t-HM-HALS) having a weight average molecular weight of at least 1600 g/mol;
  ii) a low molecular weight hindered secondary amine light stabilizer (s-LM-HALS) having a weight average molecular weight of below 1000 g/mol, preferably below 500 g/mol;
  iii) an ultraviolet synergist, being a n-alkyl-3,5-dialkylated 4-hydroxybenzoate;
  iv) an ultraviolet absorber, being a hydroxybenzotriazole compound or a hydroxyl benzophenone compound or a mixture thereof;
c) a mixture of antioxidant additives; said mixture comprising:
  i) a phenolic antioxidant, being 1,3,5-tris(4-t-butyl-2,6-dimethyl-3-hydroxy-benzyl)-iso-cyanurate, tetrakis[methylene-3(3',5'-di-t-butyl-4-hydroxy-phenyl)

propionate]methane, or 1,3,5-trimethyl-2,4,6-tris(3,5-di-t-butyl-4-hydroxy-benzyl)benzene; and ii) a phosphite additive.

In another aspect, the teaching relates to the use of such a composition for preparation of a (solar) roof building element, preferably a front layer of a photovoltaic element further comprising a back layer and a plurality of photovoltaic cells in between said front and back layers.

LIST OF DEFINITIONS

The following definitions are used in the present description and claims to define the stated subject matter. Other terms not cited below are meant to have the generally accepted meaning in the field.

"photovoltaic element" as used in the present description means: an element for a solar cell, or a solar sell module comprising a plurality of photovoltaic cells.

"transparent to light" as used in the present description means: transparent to light to such an extent that in use of the photovoltaic element electrical power is generated by the plurality of photovoltaic cells due to incident sunlight.

DESCRIPTION OF EMBODIMENTS

Hereinafter embodiments of the invention are disclosed. The embodiments are applicable to all aspects of the invention.

In an embodiment, the total amount of all components a), b), and c) of the composition add up to 100 wt. %.

In an embodiment, said random polypropylene resin is present in an amount of between 95 (e.g. 95.0) and 99.8 wt. % based on the total weight of the propylene composition. In an embodiment, said random polypropylene resin is present in an amount of between 97.5 and 99.5 wt. % based on the total weight of the propylene composition.

In an embodiment, said mixture of light stabilizing additives is present in an amount of between 0.15 and 4.0 wt. % based on the total weight of the propylene composition. In an embodiment, said mixture of light stabilizing additives is present in an amount of between 0.35 and 2.2 wt. % based on the total weight of the propylene composition.

In an embodiment, in said mixture of light stabilizing additives b) the amount of b)i) (t-HM-HALS) is between 15 and 25 wt. % of the combined weight of b)i)+b)ii)+b)iii)+b)iv), the combined weight adding up to 100 wt. %. In an embodiment, in said mixture of light stabilizing additives b) the amount of b)ii) (s-LM-HALS) is between 30 and 50 wt. % of the combined weight of b)i)+b)ii)+b)iii)+b)iv), the combined weight adding up to 100 wt. %. In an embodiment, in said mixture of light stabilizing additives b) the amount of b)iii) (ultraviolet synergist) is between 15 and 25 wt. % of the combined weight of b)i)+b)ii)+b)iii)+b)iv), the combined weight adding up to 100 wt. %. In an embodiment, in said mixture of light stabilizing additives b) the amount of b)iv) (ultraviolet absorber) is between 7 and 15 wt. % of the combined weight of b)i)+b)ii)+b)iii)+b)iv), the combined weight adding up to 100 wt. %. an embodiment, the ratio of b)i) to b)ii) to b)iii) to b)iv) is about 2:4:2:1.

In an embodiment, in said mixture of antioxidant additives c) the amount of c)i) (phenolic antioxidant) is between 25 and 40 wt. % of the combined weight of c)i)+c)ii) the combined weight adding up to 100 wt. %. In an embodiment, in said mixture of antioxidant additives c) the amount of c)ii) (phosphite additive) is between 60 and 75 wt. % of the combined weight of c)i)+c)ii), the combined weight adding up to 100 wt. %. In an embodiment, the ratio of c)i) to c)ii) is about 1:2.

In an embodiment, said low molecular weight hindered secondary amine light stabilizer (s-LM-HALS) has a weight average molecular weight below 500 g/mol.

In an embodiment, said a mixture of antioxidant additives is present in an amount of between 0.05 (e.g. 0.050) and 1.0 wt. % based on the total weight of the propylene composition. In an embodiment, said a mixture of antioxidant additives is present in an amount of between 0.15 and 0.3 (e.g. 0.30) wt. % based on the total weight of the propylene composition. In an embodiment, in said mixture of antioxidant additives c) the ratio between c)i) and c)ii) is between 0.5 (e.g. 0.50) and 2.0, e.g. between 0.8 (e.g. 0.80) and 1.2, such as between 0.9 (e.g. 0.90) and 1.1, such as 1.0, meaning that both are approximately present in the same amount. For example, when 0.2 (e.g. 0.2 0) wt. % of a mixture of antioxidant additives c) is present in a composition, it may comprise 0.1 (e.g. 0.10) wt. % of phenolic antioxidant c)i) and 0.1 (e.g. 0.10) wt. % of phosphite additive c)ii). For example, when 0.15 wt. % of a mixture of antioxidant additives c) is present in a composition, it may comprise 0.1 (e.g. 0.10) wt. % of phenolic antioxidant c)i) and 0.05 (e.g. 0.050) wt. % of phosphite additive c)ii) or vice versa. Other options may be selected by a person skilled in the art.

In an embodiment, the phenolic antioxidant c)i) is 1,3,5-tris(4-t-butyl-2,6-dimethyl-3-hydroxybenzyl)-isocyanurate. In an embodiment, the phenolic antioxidant c)i) is tetrakis [methylene-3(3',5'-di-t-butyl-4-hydroxyphenyl)propionate] methane. In an embodiment, the phenolic antioxidant is 1,3,5-trimethyl-2,4,6-tris(3,5-di-t-butyl-4-hydroxybenzyl) benzene. In an embodiment, the phosphite additive c)ii) is tris(2,4-di-tert-butylphenyl) phosphite. In an embodiment, the phenolic antioxidant c)i) is 1,3,5-tris(4-t-butyl-2,6-dimethyl-3-hydroxybenzyl)-isocyanurate and the phosphite additive c)ii) is tris(2,4-di-tert-butylphenyl) phosphite.

In an embodiment, the high molecular weight hindered tertiary amine light stabilizer has a molecular weight (Mw) of between 1800 and 5000 g/mol.

In an embodiment, the high molecular weight hindered tertiary amine light stabilizer b)i) has a molecular weight (Mw) of between 2000 and 4000 g/mol.

In an embodiment, said composition further comprising d) one or more additional additives. In an embodiment, the one or more additional additives comprise as acid scavenger, such as calcium stearate. In an embodiment, the amount of one or more additional additives is a most 5 wt. % of the composition, preferably at most 3 wt. % of the composition. In an embodiment, the amount of acid scavenger is at most 1000 ppm, such as between 250 and 750 ppm, e.g. 500 ppm.

In an embodiment, said composition further comprising d) one or more additional additives in an amount of at most 5 wt. % based on the weight of the composition. In an embodiment, the total amount of all components a), b), and c) and d) of the composition add up to 100 wt. %.

In an embodiment, the mixture of light stabilizing additives comprises as UV synergist b)iii) n-hexadecyl 3,5-di-t-butyl-4-hydroxybenzoate.

In an embodiment, the mixture of light stabilizing additives comprises as UV absorber b)iv) a compound selected from the group consisting of 2-(2'-hydroxy-3'-t-butyl-5'-methylphenyl)-5-chlorobenzotriazole and 2-hydroxy-4-octyloxy-benzo-phenone.

In an embodiment, the mixture of light stabilizing additives comprises as UV synergist b)iii) n-hexadecyl 3,5-di-t-butyl-4-hydroxybenzoate and comprises as UV absorber b)iv) a compound selected from the group consisting of 2-(2'-hydroxy-3'-t-butyl-5'-methylphenyl)-5-chlorobenzotriazole and 2-hydroxy-4-octyloxy-benzo-phenone.

In a specific embodiment, the t-HM-HALS (viz. b)i)) is 1,3,5-triazine-2,4,6-triamine, N,N'''-[1,2-ethanediylbis [[[4, 6-bis[butyl(1,2,2,6,6-pentamethyl-4-piperidinyl)amino]-1, 3,5-triazine-2-yl]imino]-3,1-propanediyl]]-bis[N',N''-dibutyl-N',N''-bis(1,2,2,6,6-pentamethyl-4-piperidinyl), the s-LM-HALS (viz. b)ii)) is mixture of esters of 2,2,6,6-tetramethyl-4-piperidinol and one or more fatty acids, the UV synergist (viz. b)iii)) is n-hexadecyl 3,5-di-t-butyl-4-hydroxybenzoate, the UV absorber (viz. b)iv)) is 2-(2'-hydroxy-3'-t-butyl-5'-methylphenyl)-5-chlorobenzotriazole, the phenolic antioxidant (viz. c)i)) is tetrakis[methylene-3 (3',5'-di-t-butyl-4-hydroxyphenyl)propionate]methane, and the phosphite additive (viz. c)ii)) is tris (2,4-di-t-butylphenyl) phosphite. In addition, an additional additive, calcium stearate, is present.

In a specific embodiment, the t-HM-HALS (viz. b)i)) is 1,3,5-triazine-2,4,6-triamine, N,N'''-[1,2-ethanediylbis [[[4, 6-bis[butyl(1,2,2,6,6-pentamethyl-4-piperidinyl)amino]-1, 3,5-triazine-2-yl]imino]-3,1-propanediyl]]-bis[N',N''-dibutyl-N',N''-bis(1,2,2,6,6-pentamethyl-4-piperidinyl), the s-LM-HALS (viz. b)ii)) is mixture of esters of 2,2,6,6-tetramethyl-4-piperidinol and one or more fatty acids, the UV synergist (viz. b)iii)) is n-hexadecyl 3,5-di-t-butyl-4-hydroxybenzoate, the UV absorber (viz. b)iv)) is 2-(2'-hydroxy-3'-t-butyl-5'-methylphenyl)-5-chlorobenzotriazole, the phenolic antioxidant (viz. c)i)) is 1,3,5-tris(4-t-butyl-2, 6-dimethyl-3-hydroxybenzyl)-isocyanurate, and the phosphite additive (viz. c)ii)) is tris(2,4-di-t-butylphenyl)phosphite. In addition, an additional additive, calcium stearate, is present.

In a specific embodiment, the t-HM-HALS (viz. b)i)) is poly[[6-[(1,1,3,3-tetramethylbutyl)amino]-s-triazine-2,4-diyl][2,2,6,6-tetramethyl-4-piperidinyl)-imino]-hexamethylene [(2,2,6,6-tetramethyl-4-piperidinyl) imino]], the s-LM-HALS (viz. b)ii)) is mixture of esters of 2,2,6,6-tetramethyl-4-piperidinol and one or more fatty acids, the UV synergist (viz. b)iii)) is n-hexadecyl 3,5-di-t-butyl-4-hydroxybenzoate, the UV absorber (viz. b)iv)) is 2-(2'-hydroxy-3'-t-butyl-5'-methylphenyl)-5-chlorobenzotriazole, the phenolic antioxidant (viz. c)i)) is tetrakis[methylene-3 (3',5'-di-t-butyl-4-hydroxyphenyl)propionate]methane, and the phosphite additive (viz. c)ii)) is tris (2,4-di-t-butylphenyl)phosphite. In addition, an additional additive, calcium stearate, is present.

In an embodiment, wherein the amount of said high molecular weight hindered tertiary amine light stabilizer b)i) is between 0.1 (e.g. 0.10) to 0.4 (e.g. 0.40) wt. %, preferably between 0.15 to 0.3 (e.g. 0.30) wt. %, such as 0.2 (e.g. 0.20) wt. %, based on the total weight of the composition. This compound may be present in the composition as such or in the form of a masterbatch. The values provided here are for the compound as such. In case for example a masterbatch having a 50% compound rate is used, a double amount of masterbatch is needed to arrive at these values. For example, a 0.4 wt. % of a 50% masterbatch would be needed to arrive at 0.2 wt. % high molecular weight hindered tertiary amine light stabilizer.

In embodiment, the amount of said low molecular weight hindered secondary amine light stabilizer b)ii) is between 0.1 (e.g. 0.10) and 1.0 wt. %, preferably between 0.2 (e.g. 0.20) to 0.6 (e.g. 0.60) wt. %, such as 0.4 (e.g. 0.40) wt. %, based on the total weight of the composition. This compound may be present in the composition as such or in the form of a masterbatch. The values provided here are for the compound as such. In case for example a masterbatch having a 50% compound rate is used, a double amount of masterbatch is needed to arrive at these values. For example, a 0.8 wt. % of a 50% masterbatch would be needed to arrive at 0.4 wt. % low molecular weight hindered secondary amine light stabilizer.

In an embodiment, the amount of said UV synergist b)iii) is between 0.1 (e.g. 0.10) and 0.5 (e.g. 0.50) wt. %, preferably between 0.2 (e.g. 0.20) and 0.4 (e.g. 0.40) wt. % based on the total weight of the composition. This compound may be present in the composition as such or in the form of a masterbatch. The values provided here are for the compound as such. In case for example a masterbatch having a 50% compound rate is used, a double amount of masterbatch is needed to arrive at these values. For example, a 0.6 wt. % of a 50% masterbatch would be needed to arrive at 0.3 wt. % UV synergist.

In an embodiment, the amount of said UV absorber b)iv) is between 0.1 (e.g. 0.10) and 0.5 (e.g. 0.50) wt. %, preferably between 0.1 (e.g. 0.10) and 0.2 (e.g. 0.20) wt. % based on the total weight of the composition. This compound may be present in the composition as such or in the form of a masterbatch. The values provided here are for the compound as such. In case for example a masterbatch having a 50% compound rate is used, a double amount of masterbatch is needed to arrive at these values. For example, a 0.3 (e.g. 0.30) wt. % of a 50% masterbatch would be needed to arrive at 0.15 wt. % UV absorber.

In an embodiment, wherein the amount of said high molecular weight hindered tertiary amine light stabilizer b)i) is between 0.1 (e.g. 0.10) to 0.4 (e.g. 0.40) wt. % based on the total weight of the composition and wherein the amount of said low molecular weight hindered secondary amine light stabilizer b)ii) is between 0.1 (e.g. 0.10) and 1.0 wt. % based on the total weight of the composition and wherein the amount of said UV synergist b)iii) is between 0.1 (e.g. 0.10) and 0.5 (e.g. 0.50) wt. % based on the total weight of the composition and wherein the amount of said UV absorber b)iv) is between 0.1 (e.g. 0.10) and 0.5 (e.g. 0.50) wt. % based on the total weight of the composition.

In an embodiment, wherein the amount of said high molecular weight hindered tertiary amine light stabilizer b)i) is between 0.15 to 0.3 (e.g. 0.30) wt. % based on the total weight of the composition and wherein the amount of said low molecular weight hindered secondary amine light stabilizer b)ii) is between 0.2 (e.g. 0.20) to 0.6 (e.g. 0.60) wt. % based on the total weight of the composition and wherein the amount of said UV synergist b)iii) is between 0.2 (e.g. 0.20) and 0.4 (e.g. 0.40) wt. % based on the total weight of the composition and wherein the amount of said UV absorber b)iv) is between 0.1 (e.g. 0.10) and 0.2 (e.g. 0.20) wt. % based on the total weight of the composition.

In an embodiment, the polypropylene resin has a melt flow rate measured according to ISO 1133:2005 at 230° C./2.16 kg of between 0.2 (e.g. 0.20) and 15 (e.g 15.0) dg/min. In an embodiment, the polypropylene resin has a melt flow rate measured according to ISO 1133:2005 at 230° C./2.16 kg of between 1.0 and 2.0, more preferably between 1.4 and 1.8 dg/min.

In an embodiment, the polypropylene resin has a C2 content of between 1.0 and 8.0 wt. %, such as between 2.0 and 5.0 wt. % based on the weight of the polypropylene resin. In an embodiment, the polypropylene resin has a C2 content of between 3.8 and 4.2 wt. % based on the weight of the polypropylene resin.

In an embodiment, the polypropylene resin has a melt flow rate measured according to ISO 1133:2005 at 230°

C./2.16 kg of between 1.0 and 2.0 dg/min and an C2 content of between 2.0 and 5.0 wt. % based on the weight of the polypropylene resin. In an embodiment, the polypropylene resin has a melt flow rate measured according to ISO 1133:2005 at 230° C./2.16 kg of between 1.4 and 1.8 dg/min and an C2 content of between 3.8 and 4.2 wt. % based on the weight of the polypropylene resin.

In an embodiment, the front layer is transparent to light. For the purpose of the invention, with "transparent to light" is meant transparent to light to such an extent that in use of the photovoltaic element electrical power is generated by the plurality of photovoltaic cells due to incident sunlight. For the purpose of the invention, with transparent to light is meant that the polymer front layer allows at least an average of 65%, preferably at least an average of 70%, more preferably at least an average of 75%, most preferably at least an average of 80% transmission of light in the wavelength range of 350 nm to 1200 nm as compared to a situation without the polymer front layer, when measuring the transmittance curves (full spectrum from 200-2500 nm) using a Perkin Elmer Lambda 950 according to ASTM D1003 (used lamp: halogen in combination with deuterium lamp). That means that the transmission of light is measured according to ASTM D1003.

The polymer front layer may be a sheet having a thickness in the range of 0.020 to 5.0 millimeter, preferably of 0.10 to 2.0 micrometer, more preferably of 0.10 to 0.50 micrometer.

The polymer back layer may be a sheet having a thickness in the range of 300 to 10000 micrometer, preferably of 300 to 3000 micrometer.

The polymer of the back layer may be chosen from the group consisting of polyolefins, such as homopolymers (PP) or random copolymers (rPP) of polypropylene, for example a polymer prepared from propylene and ethylene monomere, for example from at least 90 wt % propylene and at most 10 wt % ethylene; polyethylene (PE), e.g. linear low density polyethylene (LLDPE) or other polymers, such as polyethylene terephthalate (PET), polybutylene terephthalate (PBT), polycarbonates (PC), polymethylmethacrylate (PMMA), silicons and fluoroplastomers. The back layer may have a foamed core. Examples of materials that may be (laser) welded together include but are not limited to PP/rPP with PP, PET with PET, PET with PBT, LLDPE with PE, PC with PC and PMMA with PMMA. The polymer back layer may be prepared from a long glass fiber reinforced polypropylene, such as made by the process described in WO 2009/080281, which disclosure is incorporated by reference. Pellets comprising a thermoplastic polymer sheath intimately surrounding glass filaments, which glass filaments are covered at least in part with an impregnating agent and extend in a longitudinal direction of said pellets, are for example commercially available under the brand name STAMAX. A process for manufacturing such pellets is known from WO 2009/080281, which process comprises the subsequent steps of:

a) unwinding from a package of at least one continuous glass multifilament strand containing at most 2% by mass of a sizing composition;
b) applying from 0.5 to 20% by mass of an impregnating agent to said at least one continuous glass multifilament strand to form an impregnated continuous multifilament strand;
c) applying a sheath of thermoplastic polymer around the impregnated continuous multifilament strand to form a sheathed continuous multifilament strand;

wherein the impregnating agent is non-volatile, has a melting point of at least 20° C. below the melting point of the thermoplastic matrix, has a viscosity of from 2.5 to 100 cS at application temperature, and is compatible with the thermoplastic polymer to be reinforced.

In an embodiment, the front layer and/or the back layer may have an adhesive layer on their side facing the plurality of photovoltaic cells, wherein the composition of the adhesive of the adhesive layer is such that a self-adhesive effect is obtained after bringing the respective layer in contact with a photovoltaic cell, in such a manner that hardly any residual adhesive will remain behind on the photovoltaic cells, if at all, after removal of the respective layer from the photovoltaic cell. In practice this can be accomplished by an adhesive that is known to the skilled person. The adhesive provides temporary adhesion until the respective layer is removed, which adhesive allows easy removal of the layer. Such an adhesive does not lose its adhesive strength, or at most to a limited degree, after a connection between two parts which has been effected by means of the adhesive in question is broken by separating the parts that have been joined together by means of the adhesive joint. Said adhesive remains behind on a first part, to which the adhesive had originally been applied. Because the adhesive does not lose its adhesive strength, or at most to a limited extent when the connection is broken, the adhesive can be reused for effecting an adhesive joint with the same second part or with another second part.

Use of such an adhesive for the front layer results in the front layer being in direct contact with the photovoltaic cells, thus having no, or at most a very small, air layer in between them. This is of positive influence on the efficiency of the photovoltaic cells. Use of such an adhesive also makes recycling more efficient, since the both components may be separated from each other easily.

The plurality of photovoltaic cells may be electrically connected to each other in a parallel electrical configuration, and alternatively in series configuration. In embodiments, the plurality of cells may be divided in various groups, wherein each cell of a group is connected in series to the other cells of that group, while groups may be connected in parallel, for example. The electrical conductors may be metal strips such as comprising copper, aluminum and/or silver. Alternatively the electrical conductors may be metal wires.

The element according to the invention may have a width, and may comprise a plurality of strips of encapsulant each extending in a continuous manner over the width of the photovoltaic element, between adjacent photovoltaic cells of the plurality of photovoltaic cells.

In an embodiment, the element may have a plurality of elongate, wire-shaped, metal reinforcement elements, such as metal wires, preferably steel wires, incorporated within the back layer, distributed over the width of the back layer and extending along the length of the back layer. Such a element is highly resistant to burning objects from the outside. The plurality of elongate metal reinforcement elements may provide sufficient protection against such objects passing through the element by melting the element material, in particular the front and back layer, or at least provide sufficient delay.

The plurality of elongate metal reinforcement elements may be incorporated within the back layer by lamination, extrusion or injection moulding. Extrusion is preferred.

The invention also relates to a solar panel having a rigid, UV protective top layer which is transparent to light, such as a glass plate, connected to a photovoltaic packaging according to the invention on a front, sun facing side of the photovoltaic packaging. The person skilled in the art knows how to increase the resistance to UV (decreased degradation of the material under the influence of sunlight) of materials, for example by adding UV stabilizers as are known in the art.

Advantages of the method and solar panel according to the invention are analogous to the above mentioned advantages of the photovoltaic packaging according to the invention. Corresponding embodiments of the packaging are also applicable for the method and solar panel according to the present teachings, and vice versa.

High Molecular Weight Hindered Tertiary Amine Light Stabilizer t-HM-HALS

With t-HM-HALS is meant a hindered amine light stabilizer having a high molecular weight (e.g. a molecular weight of equal to or above 1600 g/mol) and having a tertiary amine structure. With tertiary amine structure is meant a structure wherein the hindered amine is comprised in the backbone of the t-HM-HALS or wherein the hindered amine is substituted with an alkyl group. According to the present invention, the t-HM-HALS has a molecular weight of at least 1600 g/mol, such us at least 1650 g/mol, preferably between 1800 and 5000 g/mol, more preferably between 2000 and 4000 g/mol. Examples of t-HM-HALS that are suitable for use in the present invention are the following.

An example of t-HM-HALS is 1,5,8,12-tetrakis[4,6-bis(N-butyl-N-1,2,2,6,6-pentamethyl-4-piperidylamino)-1,3,5-triazin-2-yl]-1,5,8,12-tetraazadodecane having a Mw of 2286 gram/mol. This compound is commercially available as for example Chimassorb 119; CAS no. 106990-43-6).

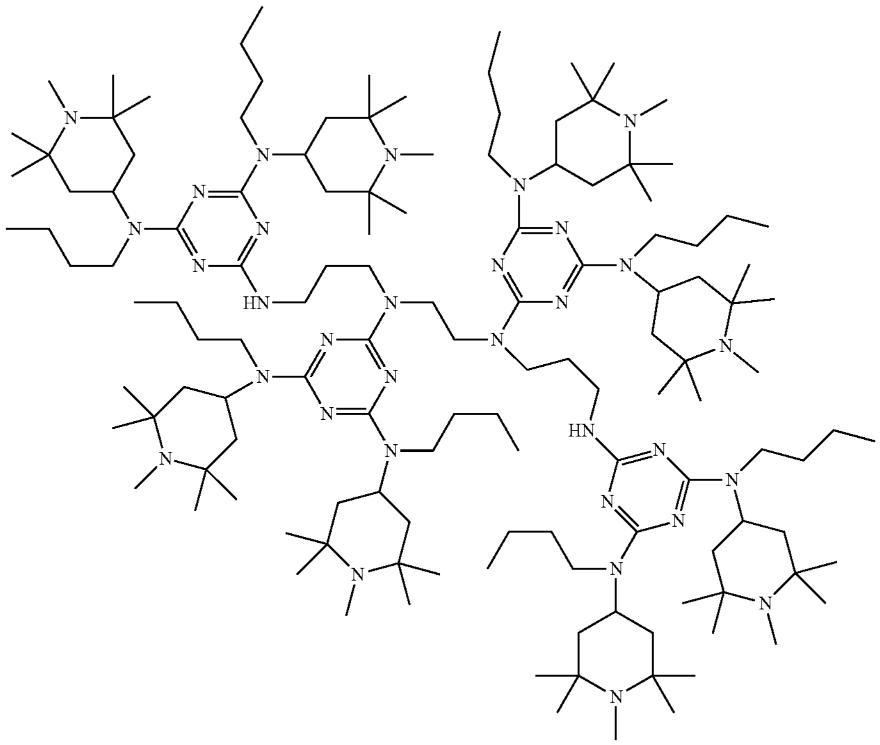 [SMILES: CCCCN(c1nc(NCCCN(CCN(CCCNc2nc(N(CCCC)C3CC(C)(C)N(C)C(C)(C)C3)nc(N(CCCC)C3CC(C)(C)N(C)C(C)(C)C3)n2)c2nc(N(CCCC)C3CC(C)(C)N(C)C(C)(C)C3)nc(N(CCCC)C3CC(C)(C)N(C)C(C)(C)C3)n2)c2nc(N(CCCC)C3CC(C)(C)N(C)C(C)(C)C3)nc(N(CCCC)C3CC(C)(C)N(C)C(C)(C)C3)n2)nc(N(CCCC)C2CC(C)(C)N(C)C(C)(C)C2)n1)C1CC(C)(C)N(C)C(C)(C)C1]

An example of a t-HM-HALS is butanedioic acid, dimethylester, polymer with 4-hydroxy-2,2,6,6-tetramethyl-1-piperidine ethanol having a Mw of 3100-4000 gram/mol. This compound is commercially available as for example Tinuvin 622; CAS no. 65447-77-0).

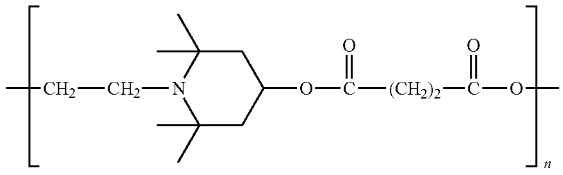

An example of a t-HM-HALS is 1,6-hexane diamine—N,N'-bis(2,2,6,6-tetramethyl-4-piperidinyl)-polymer with morpholino-2,4,6-trichloro-1,3,5-triazine having a Mw of 1700. This is commercially available as Cyasorb UV3529 from Cytec.

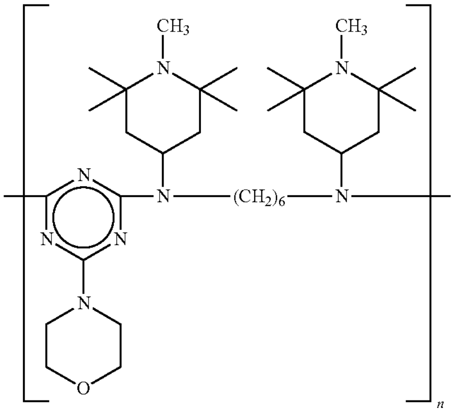

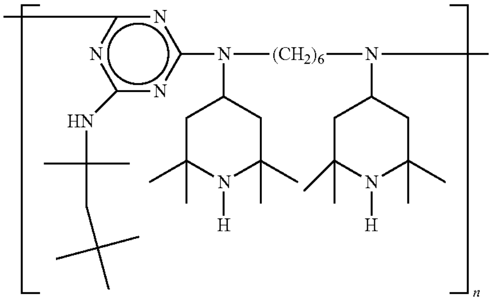

An example of a t-HM-HALS is 1,2,3,4-butanetetracarboxylic acid, polymer with β, β, β', β'-tetramethyl-2,4,8,10-tetraoxyspiro[5,5]undecane-3,9-diethanol, 1,2,2,6,6-pentamethyl-4-piperidinyl ester [CAS no. 115055-30-6] having an MW of approximately 2000. This is commercially available under several tradenames, such as ADK STAB LA63(P) from ADK Palmarole or Asahi Denka Kogyo, HALS 63 from ADK Palmarole or MARK LA63 from Asahi Denka Kogyo.

Low Molecular Weight Hindered Secondary Amine Light Stabilizer s-LM-HALS

With s-LM-HALS is meant a hindered amine light stabilizer having a low molecular weight (e.g. a molecular weight of below 1000 g/mol) and having a secondary amine structure. With secondary amine structure is meant a structure wherein the hindered amine has an attached hydrogen atom (N—H).

According to one aspect of the present invention the s-LM-HALS is an ester of 2,2,6,6-tetramethyl-4-piperidinol and a fatty acid or a mixture of esters of 2,2,6,6-tetramethyl-4-piperidinol and one or more fatty acids. Preferably, the s-LM-HALS is a mixture of esters of 2,2,6,6-tetramethyl-4-piperidinol and one or optionally more fatty acids.

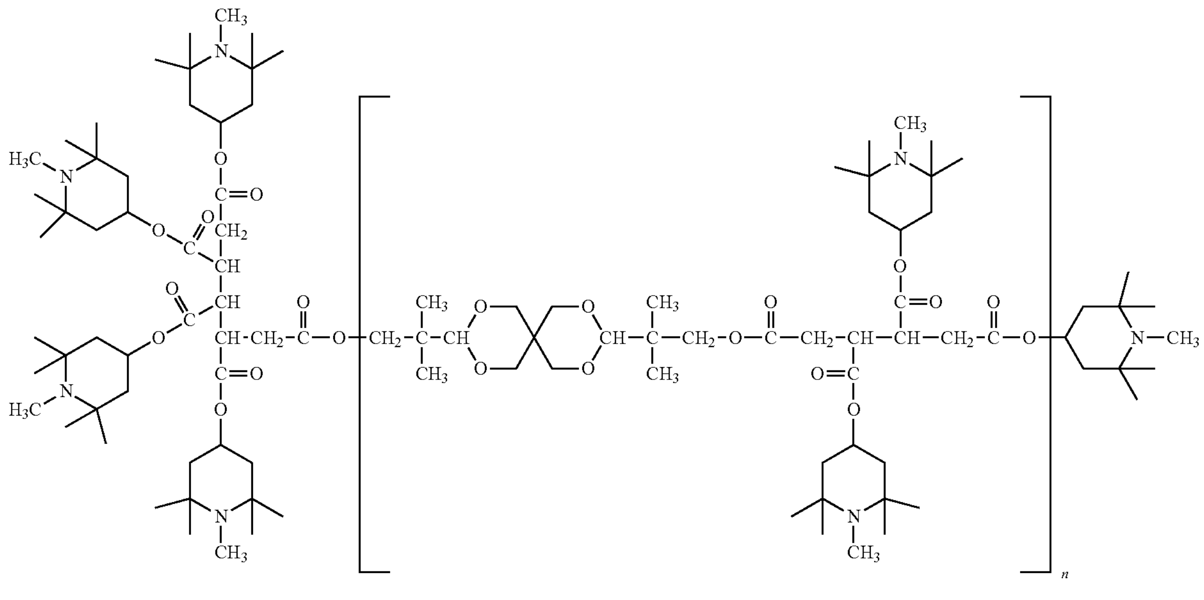

An example of a t-HM-HALS is poly[[6-[(1,1,3,3-tetramethylbutyl)amino]-1,3,5-triazine-2,4-diyl][(2,2,6,6-tetramethyl-4-piperidinyl)imino]-1,6-hexanediyl[(2,2,6,6-tetramethyl-4-piperidinyl)imino]]) [CAS no. 71878-19-8]having an MW of approximately 2500-4000. This is commercially available under several tradenames, such as Chimassorb 944.

The s-LM-HALS may be added as such or may be added in the form of a s-LM-HALS in a carrier, for example in an amount of 50% s-LM-HALS and 50% carrier (e.g. polypropylene). Examples of s-LM-HALS that are suitable for use in the present invention are the following.

An example of s-LM-HALS is an alkyl ester (e.g. a stearate or palmitate ester) or mixtures of alkyl esters of 2,2,6,6-tetramethyl-piperidinol which can e.g. be shown by the formula below. This compound may have a Mw of 423. This is commercially available under several tradenames, such as CYASORB UV3853 (from Cytec Industries), DASTIB 845 (from Chemko Chemaza A. S. Stazske), Hostavin 845 (from Clariant), Hals 845 (from ADK Palmarole), Sabostab UV91 50PP (Cas no. 86403-32-9 or CAS 24860-22-8).

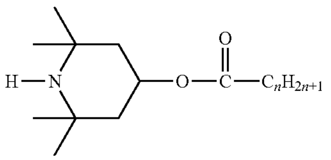

n = 15-17

An example of s-LM-HALS is bis(2,2,6,6,-tetramethyl-4-piperidyl)sebaceate (CAS no. 52829-07-9) which can be shown by the formula below. This compound has an MW of 480.

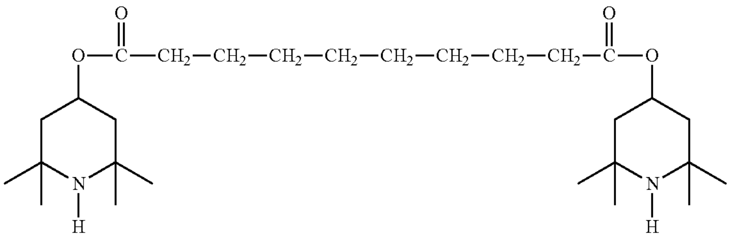

UV Synergist=n-Alkyl-3,5-di-alkylated-4-hydroxybenzoate

The alkyl group of said alkyl ester is linear or branched and optionally substituted. Preferably, said alkyl group is tert-butyl. Preferably, the phenyl group is 3,5-disubstituted with tert-butyl. In an embodiment, the n-alkyl-3,5-di-t-butyl-4-hydroxybenzoate is n-hexadecyl 3,5-di-t-butyl-4-hydroxybenzoate (the palmitate ester of 3,5-di-tert-butyl-4-hydroxy-benzoic acid), having a Mw of 474. This is commercially available as Cyasorb 2908 or CYAGARD UV2908 both from Cytec industries; CAS no. 67845-93-6.

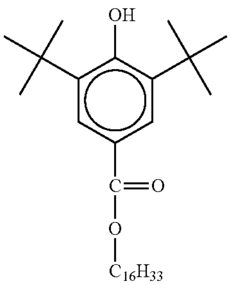

UV Absorber

According to the invention, the UV absorber is either a hydroxybenzotriazole compound or a hydroxyl benzophenone compound or a mixture thereof.

Benzotriazole (BTA) compounds have as a common structural feature a fused ring system comprising a benzene ring and a triazole ring, see the following structure:

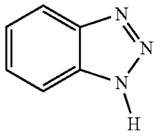

A specific example is 2-(2'-hydroxy-3'-t-butyl-5'methylphenyl)-5-chlorobenzotriazole having a molecular weight of 316, a CAS number 3896-11-5 which is for example known under the trade name Tinuvin 326; see structure below.

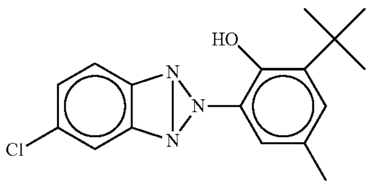

A specific example is 2-(2'-Hydroxy-3',5'-di-tert-butylphenyl)-5-chlorobenzortriazole having a molecular weight of 357.9, a CAS number 3864-99-1 which is for example known under the trade name Tinuvin 327; see structure below.

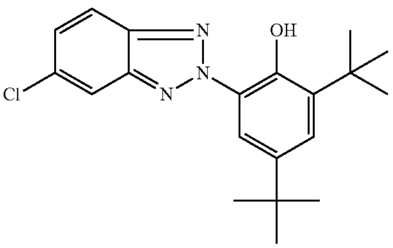 [SMILES: CC(C)(C)c1cc(-n2nc3ccc(Cl)cc3n2)c(O)c(C(C)(C)C)c1]

A specific example is 2-(2H-Benzotriazol-2-yl)-4-(1,1,3,3-tetramethylbutyl)phenol, having CAS Number: 3147-75-9 which is for example known under the trade name Tinuvin 329; see structure below.

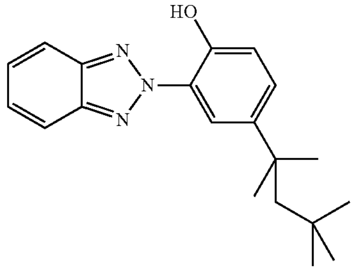 [SMILES: CC(C)(C)CC(C)(C)c1ccc(O)c(-n2nc3ccccc3n2)c1]

Hydroxyl benzophenone compounds have as a common structure feature a benzophenone double ring system comprising a hydroxyl group attached to at least one position of one of the phenyl rings. A benzophenone is shown below:

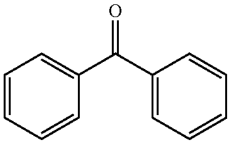 [SMILES: O=C(c1ccccc1)c1ccccc1]

A mono-hydroxyl benzophenone basic structure can have the hydroxyl group attached at e.g. the ortho, meta or para positions (see left, middle and right below respectively).

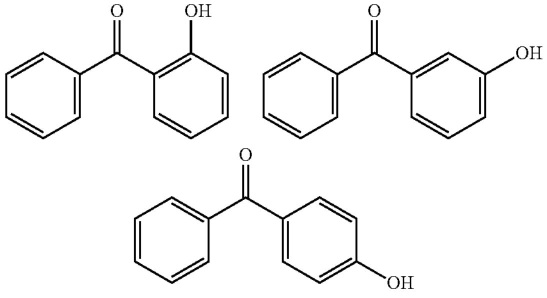

Specific examples are 2-hydroxy-4-n-C4-C12 alkyl benzophenones, such as 2-hydroxy-4-n-octyloxy benzophone, having CAS number 1843-05-6 which is commercially available as Chimassorb 81, see structure below.

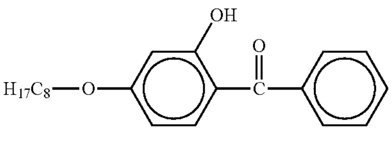

Mixture of Antioxidant Additives

This mixture of antioxidant additives comprises at least two different additives (viz. a phenolic antioxidant and a phosphite additive), each discussed in more detail below. In an embodiment, the weight ratio of said phenolic antioxidant to said phosphite additive is between 1:2 and 2:1, such as 1:1.

Phenolic Antioxidant (PAO) The present thermoplastic composition comprises from 0.05-1 wt. % of a phenolic antioxidant additive. Said phenolic antioxidant additive may comprise one, two or more phenolic groups. These phenolic antioxidant additives may be sterically hindered phenolic additives. A non-limiting list of several different types of PAO are shown below.

In an embodiment, the phenolic antioxidant comprises an alkyl ester (i.e. propionic) group. For example, the phenolic antioxidant may comprise a C8-24 alkyl ester (i.e. propionic) group, preferably a C12-20 alkyl ester group, more preferably a C14-18 alkyl ester (i.e. propionic) group. The alkyl group is preferably a linear alkyl group. In other words, the phenolic antioxidant comprises an alkyl propionate group. Non-limiting examples of phenolic antioxidants with one phenolic group are the group of alkyl-3-(3,5-di-t-butyl-4-hydroxyphenyl) esters, such as $C_{1-20}$-alkyl-3-(3,5-di-t-butyl-4-hydroxyphenyl)propionates, preferably wherein said $C_{1-20}$-alkyl is methyl, octyl, isooctyl, tridecyl, tetradecyl, pentadecyl, hexadecyl, heptadecyl, octadecyl, and nonadecyl. More preferably, wherein said $C_{1-20}$-alkyl is $C_{8-18}$-alkyl, such as octyl, isooctyl, tridecyl, tetradecyl, pentadecyl, octadecyl. As a commercial example may be mentioned octadecyl-3-(3,5-di-tert-butyl-4-hydroxyphenyl) propionate (SONGNOX® 1076 available from Songwon or Irganox® 1076 available from BASF), Isooctyl-3-(3,5-di-t-butyl-4-hydroxyphenyl)propionate (Irganox® 1135 available from BASF).

Some other non-limiting examples of phenolic antioxidants with only one phenolic group per molecule are also 2-propylene acid, 2-isopentane6[(3-isopentane-2-hydroxy-5-isopentane-phenyl)-ethyl]-4-isopentanephenylester; [1,1':3',1"-Ter-phenyl]-2'-ol, 5'-(octadecyloxy)-2,6-Di-phenyl-4-octadecyl-cyclo-oxy-phenol; 3-(3,5-Di-tert.-butyl-4-hydroxyphenyl)propionic acid, etc.

Non-limiting examples of the phenolic antioxidant with two phenolic groups comprise two C8-24 alkyl ester (i.e. propionic) groups, preferably C12-20 alkyl ester groups, more preferably C14-18 alkyl ester (i.e. propionic) groups. Examples thereof are, tri-ethylene-glycol-bis-3-(t-butyl-4-hydoxy-5-methyl-phenyl)-propionate (Irganox® 245 from BASF) and 1,6-hexane-diol-bis-3-(3,5-di-t-butyl-4-hydoxy-phenyl)-propionate (Irganox® 259 from BASF).

Some other non-limiting examples of phenolic antioxidants with two phenolic groups per molecule are also 2,2'-Methylenebis (6-t-butyl-4-methylphenol); 2,2'-Methylenebis (4-ethyl-6-t-butylphenol); 2,2'-Isobutylidenebis (4,6-dimethylphenol).

Some phenolic antioxidants which comprise more than two phenolic groups per molecule are tetrakis[methylene-3-(3,5-di-tert-butyl-4-hydroxyphenyl)-propionate]methane, tris(3,5-di-t-butyl-4-hydroxybenzyl)isocyanurate, and 1,3,5-trimethyl-2,4,6-tris(3,5-di-t-butyl-4-hydroxybenzyl)benzene. Such antioxidants increase the processing and long-term thermal stability of the resin composition of the invention.

Many of these phenolic antioxidants are commercially available.

Some examples include Irganox® 1010 (tetrakis[methylene-3(3',5'-di-t-butyl-4-hydroxyphenyl)propionate]methane, available from BASF), Irganox® 1330 (1,3,5-trimethyl-2,4,6-tris(3,5-di-t-butyl-4-hydroxybenzyl)benzene, available from BASF), Hostanox© 03 (butyric acid, 3,3-bis (3-t-butyl-4-hydroxyphenyl)ethylene ester, available from Clariant), Irganox® 3114 (1,3,5-tris(3',5'-di-t-butyl-4'-hydroxybenzyl)-s-triazine-2,4,6-(1H,3H,5H)trione, available from BASF), Cyanox© 1790 (1,3,5-tris(4-t-butyl-2,6-dimethyl-3-hydroxy-benzyl)-iso-cyanurate, available from Cytec).

Phosphite Additive

Suitable phosphite additives are phosphites and phosphonites such as triphenyl phosphite, diphenyl alkyl phosphites, phenyl dialkyl phosphites, tris(nonylphenyl) phosphite, trilauryl phosphite, trioctadecyl phosphite, distearyl pentaerythritol diphosphite, tris(2,4-di-tert-butylphenyl) phosphite (also known commercially as Irgafos 168 or as Everfos 168 or Alkanox 240 and forming 50% of the B225 additive), diisodecyl pentaerythritol diphosphite, distearylpentaerythritol diphosphite, bis(2,6-di-tert-butyl-4-methylphenyl) pentaerythritol diphosphite, bis(2,4,6-tri-tert-butylphenyl) pentaerythritol diphosphate (also known commercially as ADK STAB PEP-36), tetrakis(2,4-di-tert-butylphenyl), 4,4'-biphenylenediphosphonite, and bis(2,4-di-tert-butyl-6-methylphenyl) ethyl phosphite.

Additional Additives

The polypropylene compound may further contain additional additives like anti-oxidants, UV stabilizers, flame retardants, pigments (for example in the form of a color master batch (CMB)), dyes, adhesion promoters like modified polypropylene, in particular maleated polypropylene, antistatic agents, mold release agents, nucleating agents and the like. The amount of such additional additives is for example at most 5 wt. % based on the weight of the reinforced composition (i.e. the pellets).

Other variations to the disclosed embodiments can be understood and effected by those skilled in the art in practicing the claimed invention, from a study of the drawings, the disclosure, and the appended claims. In the claims, the word "comprising" does not exclude other elements. The invention is further elucidated by the following claims.

The invention claimed is:

1. A photovoltaic element, comprising:
- a transparent to light front layer,
- a back layer, and
- a plurality of photovoltaic cells,
- which photovoltaic cells are present between the transparent to light front layer and back layer,
- wherein the transparent to light front layer consists of a polypropylene composition, comprising:
  - a) 97.5 to 99.5 wt. % of a random polypropylene resin, based on the total weight of the polypropylene composition, wherein the random polypropylene resin has a C2 content of between 1.0 and 5.0 wt. %, based on the weight of the random polypropylene resin;
  - b) a mixture of light stabilizing additives; said mixture comprising:
    - i) a high molecular weight hindered tertiary amine light stabilizer (t-HM-HALS) having a weight average molecular weight of at least 1600 g/mol;
    - ii) a low molecular weight hindered secondary amine light stabilizer (s-LM-HALS) having a weight average molecular weight of below 1000 g/mol;
    - iii) an ultraviolet synergist, being a n-alkyl-3,5-dialkylated 4-hydroxybenzoate; and
    - iv) an ultraviolet absorber, being a hydroxybenzotriazole compound or a hydroxyl benzophenone compound or a mixture thereof;
  - c) a mixture of antioxidant additives; said mixture comprising:
    - i) a phenolic antioxidant; and
    - ii) a phosphite additive; and
  - d) 0 to 5 wt. % of one or more additional additives, based on the total weight of the polypropylene composition.

2. The photovoltaic element according to claim 1, wherein the phenolic antioxidant c)i) is 1,3,5-tris(4-t-butyl-2,6-dimethyl-3-hydroxy-benzyl)-iso-cyanurate, tetrakis[methylene-3(3',5'-di-t-butyl-4-hydroxyphenyl)propionate]methane, or 1,3,5-trimethyl-2,4,6-tris-(3,5-di-t-butyl-4-hydroxybenzyl) benzene.

3. The photovoltaic element according to claim 1, wherein the high molecular weight hindered tertiary amine light stabilizer has a molecular weight (Mw) of between 1800 and 5000 g/mol.

4. The photovoltaic element according to claim 1, wherein the polypropylene composition further comprises the d) one or more additional additives in an amount of at most 3 wt. %, based on the total weight of the polypropylene composition.

5. The photovoltaic element according to claim 1, wherein the mixture of light stabilizing additives comprises as the ultraviolet synergist b)iii) n-hexadecyl 3,5-di-t-butyl-4-hydroxybenzoate and/or wherein the mixture of light stabilizing additives comprises as the ultraviolet absorber b)iv) a compound selected from the group consisting of 2-(2'-hydroxy-3'-t-butyl-5'-methylphenyl)-5-chlorobenzotriazole and 2-hydroxy-4-n-octyloxy-benzophenone.

6. The photovoltaic element according to claim 1, wherein the amount of said high molecular weight hindered tertiary amine light stabilizer b)i) is between 0.1 to 0.4 wt. %, based on the total weight of the polypropylene composition and/or wherein the amount of said low molecular weight hindered secondary amine light stabilizer b)ii) is between 0.1 and 1.0 wt. %, based on the total weight of the polypropylene composition and/or wherein the amount of said ultraviolet synergist b)iii) is between 0.1 and 0.5 wt. %, based on the total weight of the polypropylene composition and/or wherein the amount of said ultraviolet absorber b)iv) is between 0.1 and 0.5 wt. %, based on the total weight of the polypropylene composition.

7. The photovoltaic element according to claim 1, wherein the random polypropylene resin has a C2 content of 3.8 and 4.2 wt. %, based on the weight of the random polypropylene resin.

8. The photovoltaic element according to claim 1, wherein the random polypropylene resin has a melt flow rate measured according to ISO 1133:2005 at 230° C./2.16 kg of between 0.3 and 10.0 dg/min.

9. The photovoltaic element according to claim 1, wherein
- the high molecular weight hindered tertiary amine light stabilizer b)i) is 1,3,5-triazine-2,4,6-triamine, N,N'''-11, 2-ethanediylbis [[[4,6-bis[butyl(1,2,2,6,6-pentamethyl-4-piperidinyl)amino]-1,3,5-triazine-2-yl]imino]-3,1-propanediyl]]-bis[N',N''-dibutyl-N',N''-bis(1,2,2,6,6-pentamethyl-4-piperidinyl),
- the low molecular weight hindered secondary amine light stabilizer b)ii) is a mixture of esters of 2,2,6,6-tetramethyl-4-piperidinol and one or more fatty acids,
- the ultraviolet synergist b)iii) is n-hexadecyl 3,5-di-t-butyl-4-hydroxybenzoate,
- the ultraviolet absorber b)iv) is 2-(2'-hydroxy-3'-t-butyl-5'-methylphenyl)-5-chlorobenzotriazole,
- the phenolic antioxidant c)i) is tetrakis[methylene-3(3',5'-di-t-butyl-4-hydroxyphenyl)propionate] methane, and
- the phosphite additive c)ii) is tris (2,4-di-t-butylphenyl) phosphite; and
- wherein the polypropylene composition further comprises calcium stearate.

10. The photovoltaic element according to claim 1, wherein:

the mixture of light stabilizing additives b) is present in an amount of 0.35 to 2.2 wt. %, based on the total weight of the polypropylene composition; and the mixture of antioxidant additives c) is present in an amount of between 0.05 and 1.0 wt. %, based on the total weight of the polypropylene composition.

11. The photovoltaic element according to claim 1, wherein the amount of said high molecular weight hindered tertiary amine light stabilizer b)i) is between 0.15 to 0.3 wt. %, based on the total weight of the polypropylene composition and/or wherein the amount of said low molecular weight hindered secondary amine light stabilizer b)ii) is between 0.2 and 0.6 wt. %, based on the total weight of the polypropylene composition and/or wherein the amount of said UV synergist b)iii) is between 0.2 and 0.4 wt. %, based on the total weight of the polypropylene composition and/or wherein the amount of said UV absorber b)iv) is between 0.1 and 0.2 wt. %, based on the total weight of the polypropylene composition.

12. The photovoltaic element of claim 1, wherein the random polypropylene resin has a C2 content of between 2.0 and 5.0 wt. %, based on the weight of the random polypropylene resin, and a melt flow rate measured according to ISO 1133:2005 at 230° C./2.16 kg of between 1.0 and 2.0 dg/min.

13. The photovoltaic element of claim 1, wherein the random polypropylene resin has a C2 content between 3.8 and 5.0 wt. %, based on the weight of the random polypropylene resin, and a melt flow rate measured according to ISO 1133:2005 at 230° C./2.16 kg of between 1.0 and 2.0 dg/min.

14. A photovoltaic element, comprising:

a transparent to light front layer, a back layer, and a plurality of photovoltaic cells, which photovoltaic cells are present between the transparent to light front layer and back layer, wherein the transparent to light front layer consists of a polypropylene composition, comprising:

a) 97.5 to 99.5 wt. % of a random polypropylene resin, based on the total weight of the polypropylene composition, wherein the random polypropylene resin has a C2 content of between 2.0 and 5.0 wt. %, based on the weight of the random polypropylene resin, and a melt flow rate measured according to ISO 1133:2005 at 230° C./2.16 kg of between 1.0 and 2.0 dg/min;

b) a mixture of light stabilizing additives; said mixture comprising, based on a total weight of the polypropylene composition:

i) 0.1 to 0.4 wt. % of a high molecular weight hindered tertiary amine light stabilizer (t-HM-HALS) having a weight average molecular weight of at least 1600 g/mol;

ii) 0.1 to 1.0 wt. % of a low molecular weight hindered secondary amine light stabilizer (s-LM-HALS) having a weight average molecular weight of below 1000 g/mol;

iii) 0.1 to 0.5 wt. % of an ultraviolet synergist, being n-hexadecyl 3,5-di-t-butyl-4-hydroxybenzoate; and iv) 0.1 to 0.5 wt. % of an ultraviolet absorber, being 2-(2'-hydroxy-3'-t-butyl-5'-methylphenyl)-5-chlorobenzotriazole, 2-hydroxy-4-n-octyloxy-benzophenone, or a combination thereof;

c) a mixture of antioxidant additives; said mixture comprising:

i) a phenolic antioxidant, which is 1,3,5-tris(4-t-butyl-2,6-dimethyl-3-hydroxy-benzyl)-iso-cyanurate, tetrakis[methylene-3(3',5'-di-t-butyl-4-hydroxyphenyl) propionate]methane, or 1,3,5-trimethyl-2,4,6-tris-(3,5-di-t-butyl-4-hydroxybenzyl)benzene; and ii) a phosphite additive; and d) 0 to 5 wt. % of one or more additional additives, based on the total weight of the polypropylene composition.

15. The photovoltaic element according to claim 14, wherein the high molecular weight hindered tertiary amine light stabilizer b)i) is 1,3,5-triazine-2,4,6-triamine, N,N'''-11,2-ethanediylbis [[[4,6-bis[butyl(1,2,2,6,6-pentamethyl-4-piperidinyl)amino]-1,3,5-triazine-2-yl]imino]-3,1-propanediyl]]-bis[N',N''-dibutyl-N',N''-bis(1,2,2,6,6-pentamethyl-4-piperidinyl), the low molecular weight hindered secondary amine light stabilizer b)ii) is a mixture of esters of 2,2,6,6-tetramethyl-4-piperidinol and one or more fatty acids, the ultraviolet synergist b)iii) is n-hexadecyl 3,5-di-t-butyl-4-hydroxybenzoate, the ultraviolet absorber b)iv) is 2-(2'-hydroxy-3'-t-butyl-5'-methylphenyl)-5-chlorobenzotriazole, the phenolic antioxidant c)i) is tetrakis[methylene-3(3',5'-di-t-butyl-4-hydroxyphenyl)propionate] methane, and the phosphite additive c)ii) is tris (2,4-di-t-butylphenyl) phosphite.

16. The photovoltaic element of claim 15, wherein the polypropylene composition further comprises calcium stearate.

17. The photovoltaic element of claim 14, wherein the amount of said high molecular weight hindered tertiary amine light stabilizer b)i) is between 0.15 to 0.3 wt. %, based on the total weight of the polypropylene composition, the amount of said low molecular weight hindered secondary amine light stabilizer b)ii) is between 0.2 and 0.6 wt. %, based on the total weight of the polypropylene composition, the amount of said UV synergist b)iii) is between 0.2 and 0.4 wt. %, based on the total weight of the polypropylene composition, and the amount of said UV absorber b)iv) is between 0.1 and 0.2 wt. %, based on the total weight of the polypropylene composition.

18. The photovoltaic element of claim 14, wherein the mixture of antioxidant additives c) is present in an amount of between 0.05 and 1.0 wt. %, based on the total weight of the polypropylene composition.

19. The photovoltaic element of claim 14, wherein a weight ratio of b)i) to b)ii) to b)iii) to b)iv) is about 2:4:2:1.

20. The photovoltaic element of claim 14, wherein a weight ratio of c)i) to c)ii) is about 1:2.

* * * * *